(12) United States Patent
Shiozawa et al.

(10) Patent No.: US 7,795,738 B2
(45) Date of Patent: Sep. 14, 2010

(54) NITRIDE SEMICONDUCTOR DEVICE

(75) Inventors: Katsuomi Shiozawa, Tokyo (JP); Kyozo Kanamoto, Tokyo (JP); Hiroshi Kurokawa, Tokyo (JP); Yasunori Tokuda, Tokyo (JP); Kyosuke Kuramoto, Tokyo (JP); Hitoshi Sakuma, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 35 days.

(21) Appl. No.: 12/327,874

(22) Filed: Dec. 4, 2008

(65) Prior Publication Data
US 2009/0146308 A1   Jun. 11, 2009

(30) Foreign Application Priority Data
Dec. 7, 2007 (JP) .............................. 2007-317070

(51) Int. Cl.
*H01L 29/45* (2006.01)
*H01L 21/20* (2006.01)

(52) U.S. Cl. ............... 257/761; 257/745; 257/E29.144; 257/E21.09; 438/483

(58) Field of Classification Search ................ 257/745, 257/761, E29.144, E21.09; 438/483
See application file for complete search history.

(56) References Cited

U.S. PATENT DOCUMENTS 6,774,025 B2   8/2004   Uemura

| 7,009,218 B2* | 3/2006 | Sugimoto et al. ............. 257/99 |
| 7,101,780 B2* | 9/2006 | Uemura ...................... 438/605 |
| 2006/0243988 A1* | 11/2006 | Narukawa et al. ............. 257/79 |
| 2008/0006836 A1* | 1/2008 | Lee .............................. 257/98 |
| 2008/0017868 A1* | 1/2008 | Yoneda ........................ 257/79 |
| 2009/0130790 A1* | 5/2009 | Kanamoto et al. ............ 438/39 |
| 2009/0140389 A1* | 6/2009 | Shiozawa et al. ........... 257/613 |

FOREIGN PATENT DOCUMENTS

| JP | 2000-12899 A | 1/2000 |
| JP | 2002-368272 A | 12/2002 |
| JP | 2007-081313 | 3/2007 |

\* cited by examiner

*Primary Examiner*—Victor A Mandala
(74) *Attorney, Agent, or Firm*—Leydig, Voit & Mayer, Ltd.

(57) ABSTRACT

A nitride semiconductor device with a p electrode having no resistance between itself and other electrodes, and a method of manufacturing the same are provided. A p electrode is formed of a first Pd film, a Ta film, and a second Pd film, and on a p-type contact layer of a nitride semiconductor. On the second Pd film, a pad electrode is formed. The second Pd film is formed on the entire upper surface of the Ta film which forms part of the p electrode, and serves as an antioxidant film that prevents oxidation of the Ta film. Preventing oxidation of the Ta film, the second Pd film can reduce the resistance that may exist between the p electrode and the pad electrode, thereby preventing a failure in contact between the p electrode and the pad electrode and providing the p electrode with low resistance.

16 Claims, 7 Drawing Sheets

NITRIDE SEMICONDUCTOR DEVICE

BACKGROUND OF THE INVENTION

1. Field of the Invention

The present invention relates to a nitride semiconductor device and a method of manufacturing the same.

2. Description of the Background Art

Conventional nitride semiconductor devices are manufactured by forming and heat-treating a p electrode on a p-type contact layer and then forming a pad electrode on the p electrode (refer to, for example, Japanese Patent Nos. 3427732 and 3765246.)

Performing heat treatment in an atmosphere containing oxygen after the formation of a p electrode, as described above, induces oxidation of the p electrode, thus forming an oxide film. Forming a pad electrode on this p electrode means that a pad electrode is formed with the oxide film present as an insulator on the p electrode, so that the oxide film can cause a failure in contact between the p electrode and the pad electrode formed on the p electrode.

Such a failure in contact between the p electrode and the pad electrode will increase the resistance between the electrodes, and for example if a nitride semiconductor device is a laser diode, there will occur an increase in the operating voltage of the laser diode and variations in electrical characteristics due to heat generation during operation. This consequently makes it difficult to provide stable power output within a specified temperature range. The above resistance can also be a factor in reducing yield.

It is thus desired that connectivity between the p electrode and the pad electrode be improved to reduce its influence on device characteristics.

SUMMARY OF THE INVENTION

An object of the invention is to provide a nitride semiconductor device with a p electrode having no resistance between itself and other electrodes, and a method of manufacturing such a nitride semiconductor device.

According to an aspect of the invention, a nitride semiconductor device includes a p-type contact layer, a p electrode, and a pad electrode. The p-type contact layer is formed of a nitride semiconductor. The p electrode is formed of a first palladium (Pd) film, a tantalum (Ta) film, and a second Pd film. The first Pd film and the Ta film are formed in order of mention on the p-type contact layer. The second Pd film is formed on an entire upper surface of the Ta film. The pad electrode is formed on the p electrode. The second Pd film, which forms part of the p electrode, has a thickness of 50 to 150 nm.

The above nitride semiconductor device can prevent a failure in contact between the p electrode and the pad electrode, thereby providing the p electrode with low resistance. It is thus possible, as compared with conventional techniques, to reduce the operating voltage of the nitride semiconductor device and to cut heat generation during operation, thus achieving high-power and stable operation.

According to another aspect of the invention, a method of manufacturing a nitride semiconductor device includes a p-electrode forming step and a heat-treatment step. In the p-electrode forming step, a first palladium (Pd) film and a tantalum (Ta) film are formed in order of mention on a p-type contact layer of a nitride semiconductor, and then a second Pd film is formed, as an antioxidant film that prevents oxidation of the Ta film, on an entire upper surface of the Ta film, to thereby form a p electrode of the first Pd film, the Ta film, and the second Pd film. The second Pd film is formed to a thickness of 50 to 150 nm. In the heat-treatment step, the p electrode formed is heat-treated.

The above method of manufacturing a nitride semiconductor device can prevent a failure in contact between the p electrode and a pad electrode, thus stabilizing the provision of the p electrode with low resistance. It is thus possible, as compared with conventional techniques, to reduce the operating voltage of the nitride semiconductor device and to cut heat generation during operation, thus producing a nitride semiconductor device that achieves high-power and stable operation.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
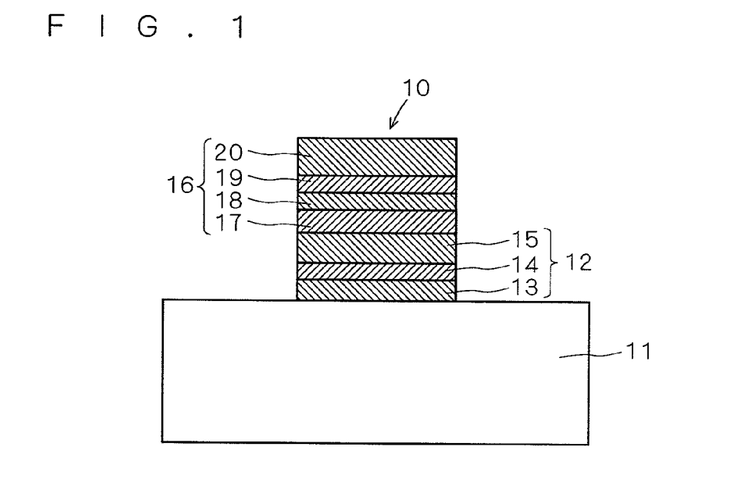
FIG. 1 is a cross-sectional view illustrating the structure of a nitride semiconductor device 10 according to a preferred embodiment of the invention.

FIG. 1 is a cross-sectional view illustrating the structure of a nitride semiconductor device 10 according to a preferred embodiment of the invention. The nitride semiconductor device 10 is formed using a gallium nitride (GaN) substrate which is a nitride semiconductor substrate.

In the nitride semiconductor device 10, a p electrode 12 is formed on a p-type contact layer 11 of a nitride semiconductor. The p electrode 12 is formed of a first palladium (Pd) film 13, a tantalum (Ta) film 14, and a second Pd film 15 which is an antioxidant film that prevents oxidation of the Ta film 14. The first Pd film 13 and the Ta film 14 are formed in order of mention on the p-type contact layer 11, and then the second Pd film 15 is formed on the entire upper surface of the Ta film 14. In the present example, the p-type contact layer 11 is formed of a p-type $Al_xGa_{1-x}N$ ($0 \leq x \leq 1$).

The first Pd film 13 and the Ta film 14, which form the p electrode 12, each should have a thickness on the order of 10 to 100 nm. The first Pd film 13 is necessary for establishing an ohmic contact with the p-type contact layer 11, and the Ta film 14 is necessary for inhibiting cohesion and promoting ohmic properties of the first Pd film 13 during heat treatment which will be described later. For instance, the first Pd film 13 has a thickness of about 55 nm, and the Ta film 14 has a thickness of about 15 nm. The thickness of the second Pd film 15, which is an antioxidant film, will be described later.

In the nitride semiconductor device 10, a pad electrode 16 is formed on the second Pd film 15 which is an antioxidant film. The pad electrode 16 should desirably be made of a material containing titanium (Ti). Specific examples of the material for the pad electrode 16 according to the present preferred embodiment include Ti, Ta, gold (Au), and molybdenum (Mo). The pad electrode 16 has specifically a Ti—Ta—Ti—Au four-layer structure in which a Ti film 17, a Ta film 18, another Ti film 19, and an Au film 20 are formed in order of mention on the p electrode 12. Alternatively, the pad electrode 16 may have a Ti—Mo—Ti—Au four-layer structure in which a Ti film, a Mo film, another Ti film, and an Au film are formed in order of mention on the p electrode 12.

Figure 2:
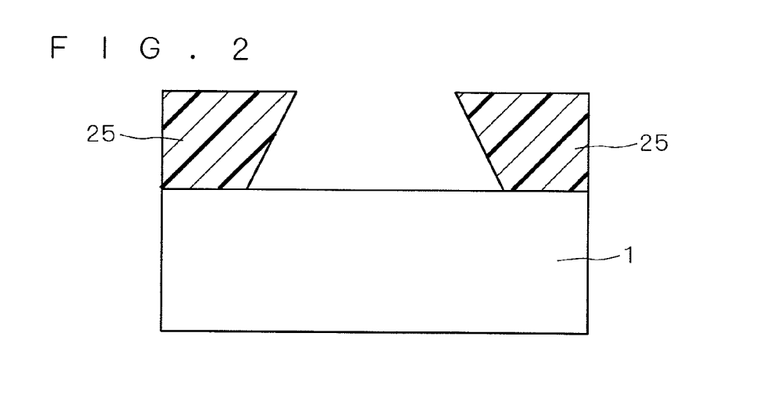
FIGS. 2 to 6 are cross-sectional views illustrating a method of manufacturing the nitride semiconductor device 10 according to the preferred embodiment of the invention.
Figure 3:
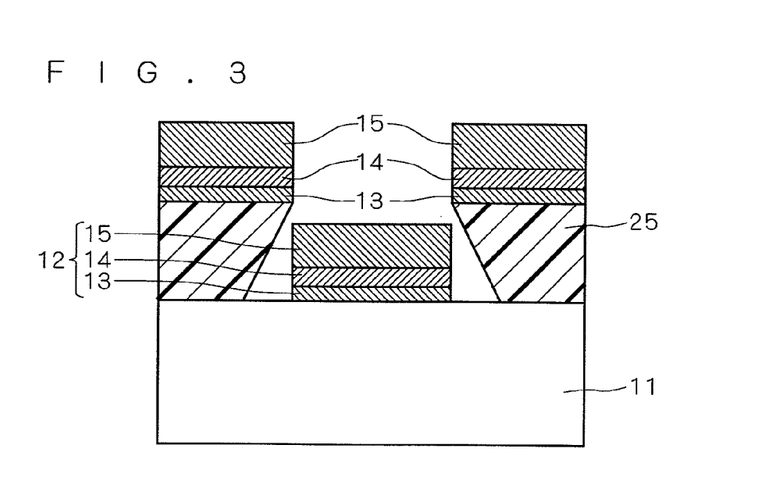
Figure 4:
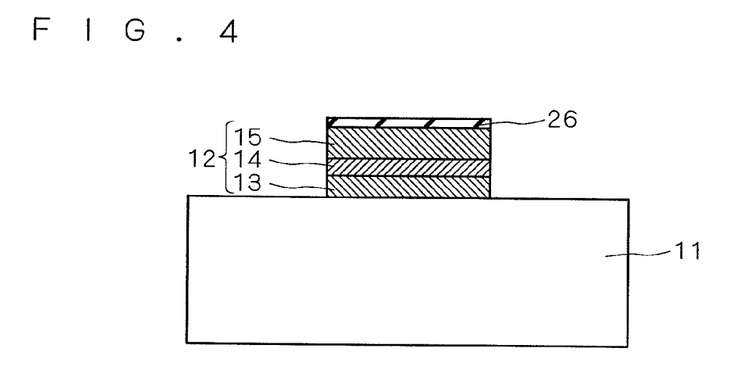

Next, a method of manufacturing the nitride semiconductor device 10 according to the preferred embodiment of the invention is described. FIGS. 2 to 6 are cross-sectional views illustrating the method of manufacturing the nitride semiconductor device 10 according to the preferred embodiment of the invention. First, as shown in FIGS. 2 to 4, a material for the p electrode 12 (hereinafter referred to also as a "p-electrode material") is selectively formed by a lift-off method on the p-type contact layer 11. To be more specific, first as shown in FIG. 2, a mask 25 for use in selective formation of a p-electrode material is formed on the p-type contact layer 11. The mask 25 is formed in all areas other than the area where the p electrode 12 will be formed (hereinafter referred also to as a "p-electrode forming area") on the p-type contact layer 11. The mask 25 is formed of, for example, a resist.

After the formation of the mask 25, as shown in FIG. 3, the first Pd film 13, the Ta film 14, and the second Pd film 15 as an antioxidant film, which form the p electrode 12, are formed by deposition in order of mention on both the area of the p-type contact layer 11 which is not covered with the mask 25, i.e., the p-electrode forming area and the mask 25, using electron-beam (EB) evaporation or sputtering techniques.

After the deposition of the first Pd film 13, the Ta film 14, and the second Pd film 15, as shown in FIG. 4, the mask 25 is removed so that an unnecessary part, i.e., any part of the p-electrode material other than the p-electrode forming area, is removed together with the mask 25. This allows selective formation of the p-electrode material on the p-type contact layer 11. The step of forming the first Pd film 13 and the Ta film 14 in order of mention on the p-type contact layer 11 and then forming the second Pd film 15, which is an antioxidant film, on the entire upper surface of the Ta film 14 to thereby form the p electrode 12 of the first Pd film 13, the Ta film 14, and the second Pd film 15 corresponds to a p-electrode forming step.

The p electrode 12 formed in this way is then heat-treated in a heat-treatment step. For desired contact resistance, such heat treatment is necessary after the formation of the p electrode 12. In the heat-treatment step, the p electrode 12 should desirably be heat-treated in an atmosphere of the gas containing oxygen atoms. The oxygen-atom-containing gas may, for example, be a gas that contains at least any one of oxygen ($O_2$), ozone ($O_3$), nitrogen monoxide (NO), nitrogen dioxide ($NO_2$), carbon monoxide (CO), carbon dioxide ($CO_2$), and water vapor ($H_2O$), and it may, for example, be the air. The heat-treatment temperature may be any suitable temperature determined according to the materials and the structures of the p electrode 12.

Although the heat treatment in the aforementioned atmosphere of the gas containing oxygen atoms will produce a Pd oxide film 26 on the second Pd film 15, since the upper surface of the Ta film 14 which forms part of the p electrode 12 is entirely covered with the second Pd film 15, there will occur no oxidation of the Ta film 14 which forms part of the p electrode 12. In other words, the formation of the second Pd film 15 as an antioxidant film on the entire upper surface of the Ta film 14 which forms part of the p electrode 12 can inhibit oxidation of the Ta film 14 which forms part of the p electrode 12, thereby allowing the formation of a pad electrode 16, which exhibits a good electrical characteristic even after the heat treatment, on the p electrode 12.

Figure 5:
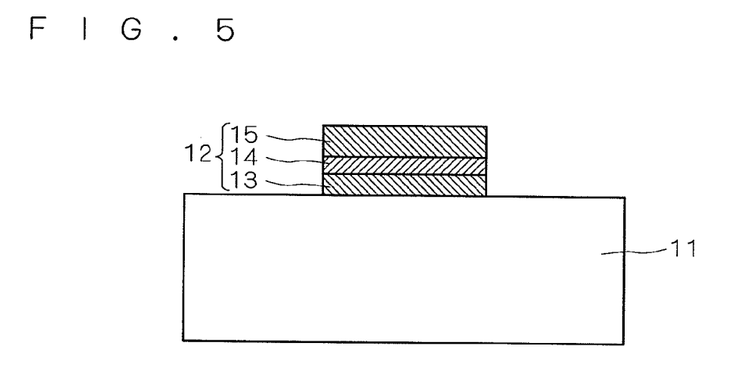

After the heat treatment, as shown in FIG. 5, the Pd oxide film 26 formed on the surface of the second Pd film 15 is removed in a removal step. The removal of the Pd oxide film 26 is implemented using an acid solution. More specifically, the Pd oxide film 26 can be removed by about 10-minute immersion in a hydrochloric acid solution. The surface of the second Pd film 15 after going through the processing using a hydrochloric acid solution will have a similar metallic luster to what it had before the heat treatment. The removal of the Pd oxide film 26 may be performed either immediately after the heat treatment, or after the formation of a pattern for use in forming the pad electrode 16 which will be described later. It is however preferable that the Pd oxide film 26 be removed immediately after the heat treatment because of higher flexibility in the process of manufacturing the nitride semiconductor device 10.

The removal of the Pd oxide film 26 may be implemented by either a removal technique using wet etching in a hydrochloric acid solution, as described above, or a removal technique using dry etching in a halocarbon gas such as carbon tetrafluoride ($CF_4$) or carbon tetrachloride ($CCl_4$).

Figure 6:
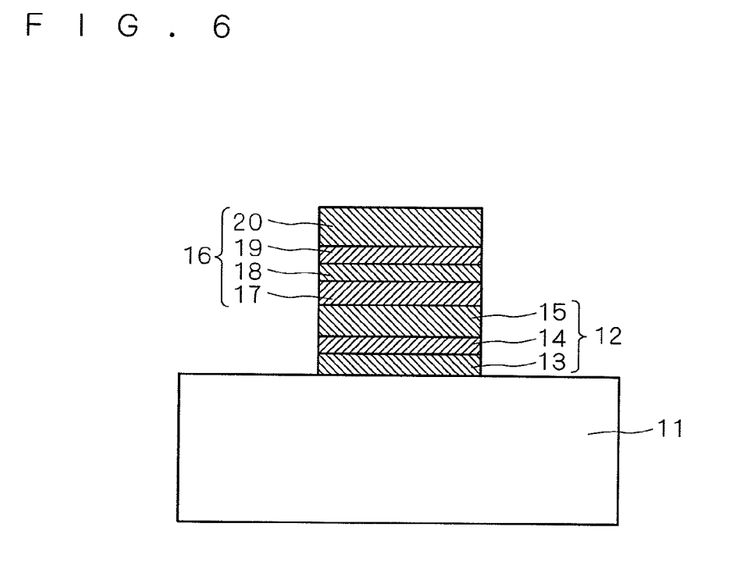

After the removal of the Pd oxide film 26, in a pad-electrode forming step as shown in FIG. 6, the pad electrode 16 is formed for wire bonding or the like on the p electrode 12, more specifically, on the second Pd film 15. The pad electrode 16 has, for example, a Ti—Ta—Ti—Au four-layer structure in which a Ti film 17, a Ta film 18, another Ti film 19, and an Au film 20 are formed in order of mention on the p electrode 12. The pad electrode 16 can be formed by EB evaporation or sputtering in the same way as the p-electrode material. The thickness of the pad electrode 16 may vary depending on the processing performed after the pad electrode is formed.

When the pad electrode 16 is formed by sputtering, it is unnecessary to provide, after the heat treatment, an additional of removing the Pd oxide film 26 formed on the surface of the second Pd film 15, and it is possible to remove the Pd oxide film 26 by reverse sputtering prior to the formation of the pad electrode 16. Through the steps described above, the nitride semiconductor device 10 is manufactured.

Figure 7:
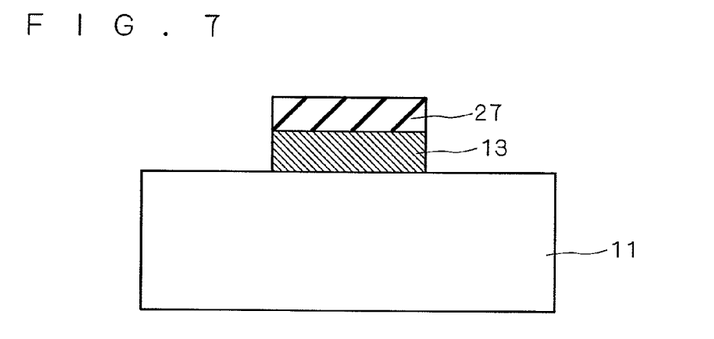
FIG. 7 is a cross-sectional view illustrating the structure of the nitride semiconductor device 10 when the heat treatment is performed without the provision of the second Pd film 15 which is an antioxidant film.
Figure 8:
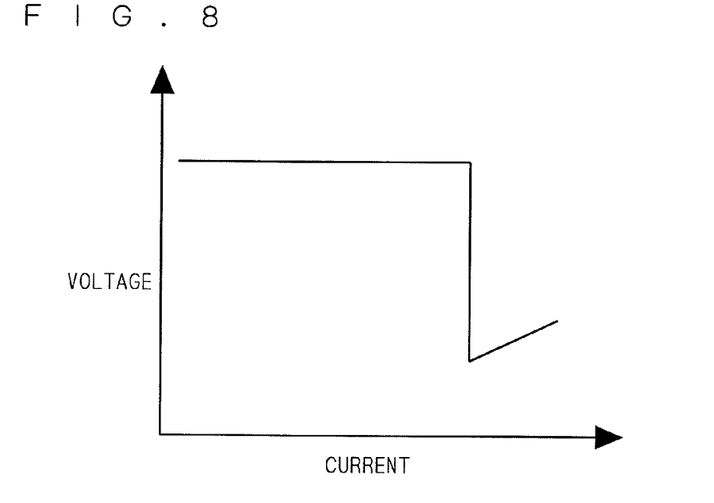
FIG. 8 is a graph showing a voltage-current characteristic between a p electrode 12 and a pad electrode 16 when no second Pd film 15 is formed.
Figure 9:
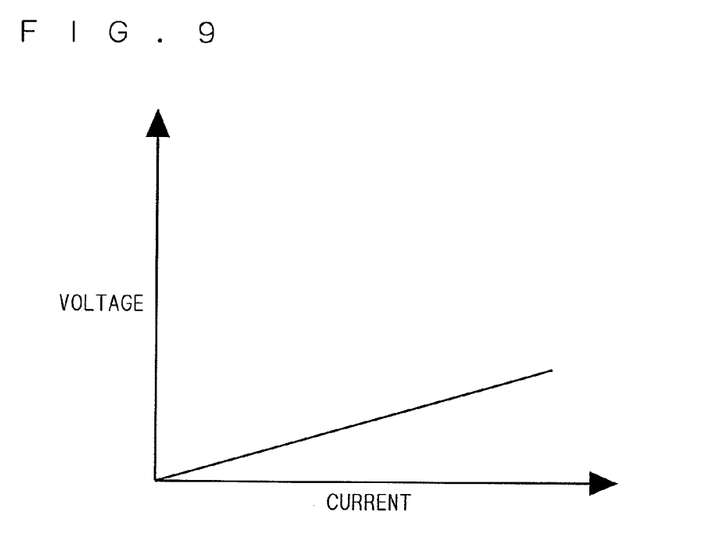
FIG. 9 is a graph showing a voltage-current characteristic between the p electrode 12 and the pad electrode 16 when the second Pd film 15 is formed.

Next, an electrical characteristic between the p electrode 12 and the pad electrode 16 is described. FIG. 7 is a cross-sectional view illustrating the structure of the nitride semiconductor device 10 when heat treatment is performed without the provision of the second Pd film 15 which is an antioxidant film. FIG. 8 is a graph showing a voltage-current characteristic between the p electrode 12 and the pad electrode 16 when no second Pd film 15 is formed, and FIG. 9 is a graph showing a voltage-current characteristic between the p electrode 12 and the pad electrode 16 in the case of the preferred embodiment, i.e., when the second Pd film 15 is formed. In FIGS. 8 and 9, the horizontal axis represents current, and the vertical axis represents voltage.

When the first Pd film 13 and the Ta film 14, which form the p electrode 12, are heat-treated in an atmosphere of the gas containing oxygen atoms, the Ta film 14 is oxidized to a Ta oxide film 27 by this heat treatment. This oxidation of the Ta film 14 occurs not only at the surface of the Ta film 14 but also throughout the whole Ta film 14. In other words, the entire Ta film 14 is oxidized so that, as shown in FIG. 7, the Ta oxide film 27 is formed on the first Pd film 13 to cover the entire upper surface of the first Pd film 13.

In this condition, even if an effort is made to produce a current flow between the p electrode 12 and the pad electrode 16 through the formation of the pad electrode 16 on the p electrode 12, i.e., on the Ta oxide film 27, the Ta oxide film 27 formed by the heat treatment will make high resistance so that no current can flow as shown in FIG. 8. That is, a good electrical characteristic cannot be achieved.

In the present preferred embodiment, on the other hand, since the second Pd film 15 which is an antioxidant film is formed on the entire upper surface of the Ta film 14 which forms part of the p electrode 12, only the surface of the second Pd film 15 is oxidized to the Pd oxide film 26.

Thus, no high-resistance film is formed, such as the aforementioned Ta oxide film 27, and the formation of the pad electrode 16 after the removal of the Pd oxide film 26 on the surface of the second Pd film 15 can provide low-resistance connection between the p electrode 12 and the pad electrode 16. The voltage-current characteristic can thus exhibit, as shown in FIG. 9, linear properties, i.e. ohmic properties, thereby achieving a good electrical characteristic.

The thickness of the second Pd film 15, which is an antioxidant film, should desirably be such a thickness that prevents oxidation of the Ta film 14 and allows the second Pd film 15 to remain on the Ta film 14 even after the removal of the Pd oxide film 26 formed by the oxidation of the surface of the second Pd film 15. Although an increase in the thickness of the second Pd film 15 will increase the effect of protecting the Ta film 14 which is in contact with the second Pd film 15, an excessive increase in the thickness of the second Pd film 15 can make shape processing or the like difficult in the process of manufacturing a nitride semiconductor device. Thus, an upper limit to the thickness of the second Pd film 15 is determined under limiting manufacturing conditions such as lift-off properties, resist resistance, or overheating. From this, it is desirable that the thickness of the second Pd film 15 be between 50 and 150 nm.

If the thickness of the second Pd film 15 is less than 50 nm, the oxidation of the Ta film 14 cannot be prevented enough so that it is difficult to achieve low-resistance connection between the p electrode 12 and the pad electrode 16. Besides, since the whole second Pd film 15 is oxidized to the Pd oxide film 26, no second Pd film 15 will remain on the Ta film 14 after the removal of the Pd oxide film 26, which causes oxidation of the Ta film 14 after the removal of the Pd oxide film 26, thereby making it difficult to achieve low-resistance connection between the p electrode 12 and the pad electrode 16. If the thickness of the second Pd film 15 exceeds 150 nm, on the other hand, it is difficult to form a desired shape of the second Pd film 15, which reduces productivity.

Figure 10:
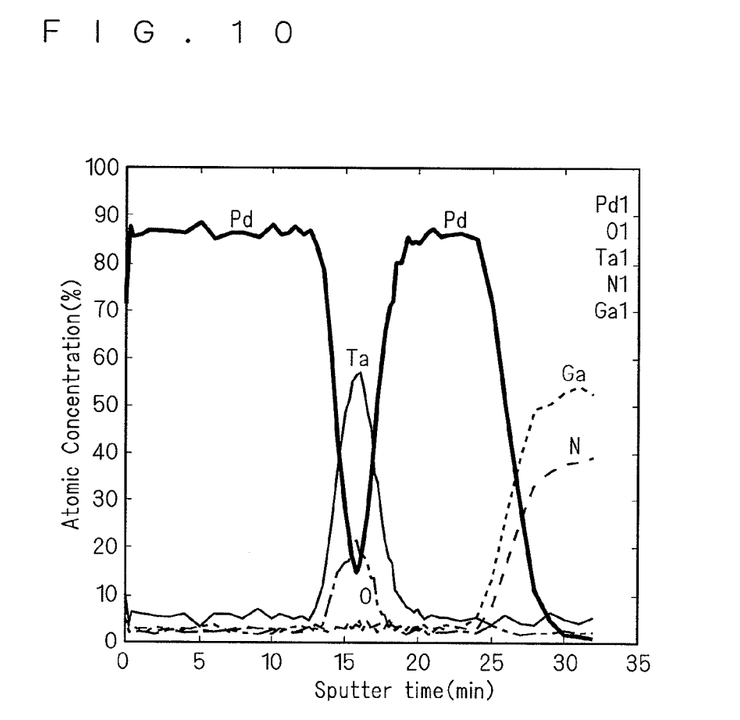
FIG. 10 is a graph showing a profile of the p electrode 12 prior to heat treatment.
Figure 11:
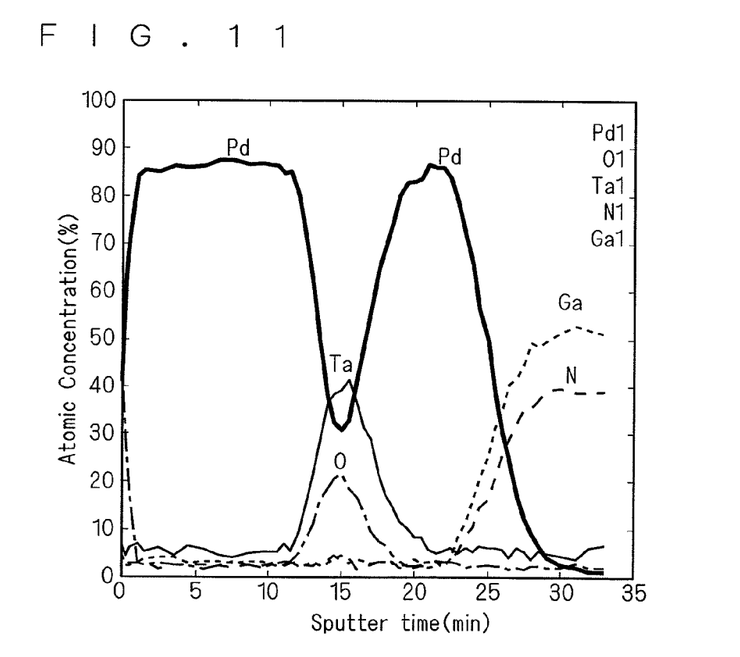
FIG. 11 is a graph showing a profile of the p electrode 12 after heat treatment.

FIG. 10 is a graph showing a profile of the p electrode 12 prior to heat treatment. FIG. 11 is a graph showing a profile of the p electrode 12 after heat treatment. The graph in FIG. 11 shows a profile of the p electrode 12 that is heat-treated at 425° C. in an atmosphere of the gas containing oxygen atoms. The profiles of the p electrode 12 in FIGS. 10 and 11 show the results obtained by measuring the layers from the second Pd film 15 of the p electrode 12 to the p-type contact layer 11 by AES (Auger electron spectroscopy). In FIGS. 10 and 11, the horizontal axis represents sputter time (min), and the vertical axis represents atomic concentration (%).

The graphs in FIGS. 10 and 11 show that the heat treatment after the formation of the p electrode 12 increases the oxygen-atom concentration within the Ta film 14 which forms part of the p electrode 12. The graphs in FIGS. 10 and 11 also show that the heat treatment after the formation of the p electrode 12 causes oxidation of the surface of the second Pd film 15 which forms part of the p electrode 12. Still more, it is clear from the graph in FIG. 11 that not all Pd and Ta, which are p-electrode materials, are mixed together by the heat treatment of the p electrode 12 and that almost an initial three-layer structure is maintained, specifically, a Pd—Ta—Pd three-layer structure of the first Pd film 13, the Ta film 14, and the second Pd film 15 formed in order of mention.

Figure 12:
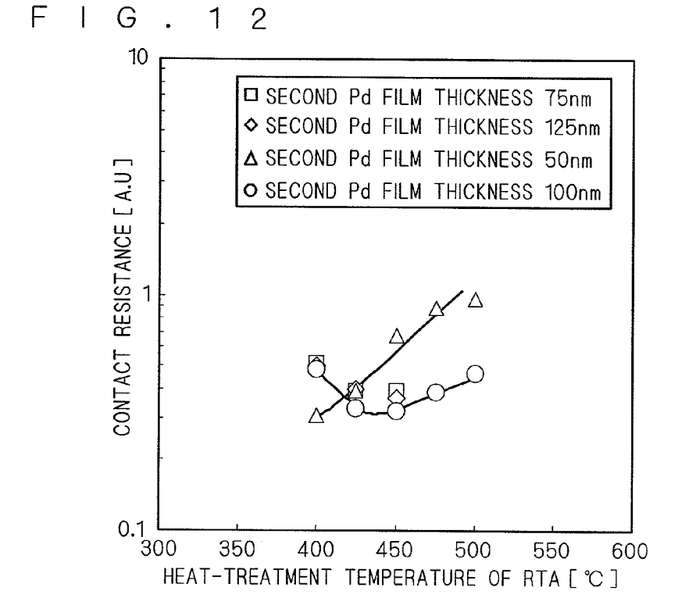
FIG. 12 is a graph showing the relationship between the heat-treatment temperature after the formation of the p electrode and the contact resistance between a p-type contact layer 11 and the p electrode 12.

FIG. 12 is a graph showing the relationship between heat-treatment temperature after the formation of the p electrode 12 and contact resistance between the p-type contact layer 11 and the p electrode 12. In FIG. 12, the horizontal axis represents heat-treatment temperature (° C.) of rapid thermal annealing (RTA), and the vertical axis represents contact resistance (relative value; A.U). Referring to FIG. 12, a triangle symbol (Δ) represents a case of the second Pd film 15 with a thickness of 50 nm; a square symbol (□) represents a case of the second Pd film 15 with a thickness of 75 nm; a circular symbol (○) represents a case of the second Pd film 15 with a thickness of 100 nm; and a diamond-shaped symbol (◇) represents a case of the second Pd film 15 with a thickness of 125 nm.

The graph in FIG. 12 shows that, in order to achieve relatively low contact resistance between the p-type contact layer 11 and the p electrode 12, the p electrode 12 should preferably be heat-treated at heat-treatment temperatures between 400 and 500° C. This graph in FIG. 12 also shows that the p electrode 12 should more preferably be heat-treated at heat-treatment temperatures in the range of 400 to 500° C. that achieve a small change in resistance, specifically between 425 and 475° C.

Figure 13:
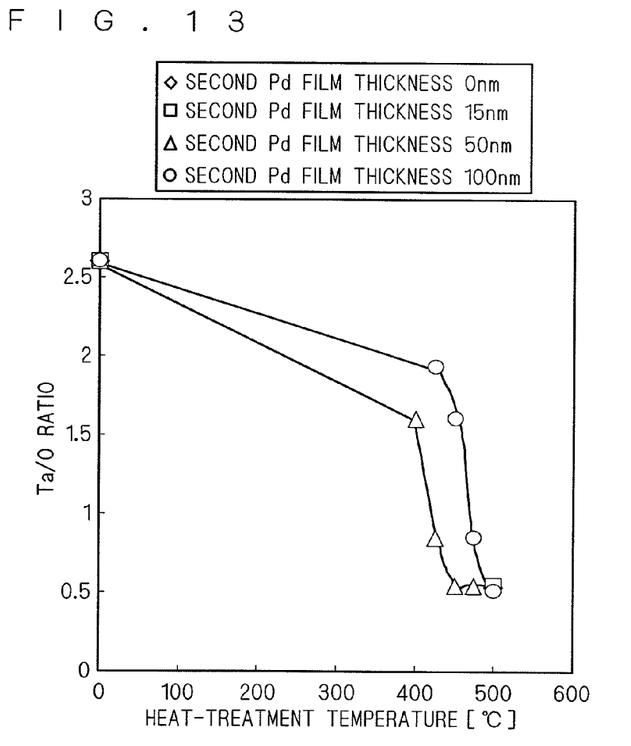
FIG. 13 is a graph showing the relationship between the heat-treatment temperature and the Ta/O ratio within a Ta film 14 which forms part of the p electrode 12.

FIG. 13 is a graph showing the relationship between heat-treatment temperature and Ta/O ratio within the Ta film 14 which forms part of the p electrode 12. In FIG. 13, the horizontal axis represents heat-treatment temperature (° C.), and the vertical axis represents Ta/O ratio. The value of the Ta/O ratio in FIG. 13 is calculated from the measurement results by AES. Referring to FIG. 13, a diamond-shaped symbol (◇) represents a case of the second Pd film 15 with a thickness of 0 nm, i.e., where there is no second Pd film 15; a square symbol (□) represents a case of the second Pd film 15 with a thickness of 15 nm; a triangle symbol (Δ) represents a case of the second Pd film 15 with a thickness of 50 nm; and a circular symbol (○) represents a cases of the second Pd film 15 with a thickness of 100 nm.

The graph in FIG. 13 shows that, when consideration is given to the oxidation of Ta within the Ta film 14 which forms part of the p electrode 12, the p electrode 12 should preferably be heat-treated at heat-treatment temperatures in the range of 400 to 475° C.

From these results in FIGS. 12 and 13, it is found that a common preferable range of the heat-treatment temperature for the heat treatment of the p electrode 12 is between 425 and 475° C.

Figure 14:
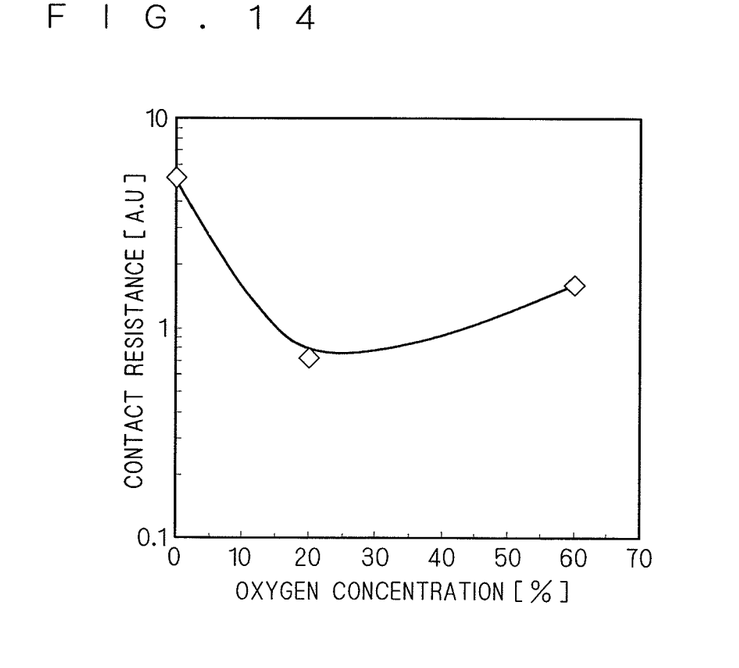
FIG. 14 is a graph showing the relationship between the oxygen concentration in the atmosphere during heat treatment and the contact resistance between the p-type contact layer 11 and the p electrode 12.
Figure 15:
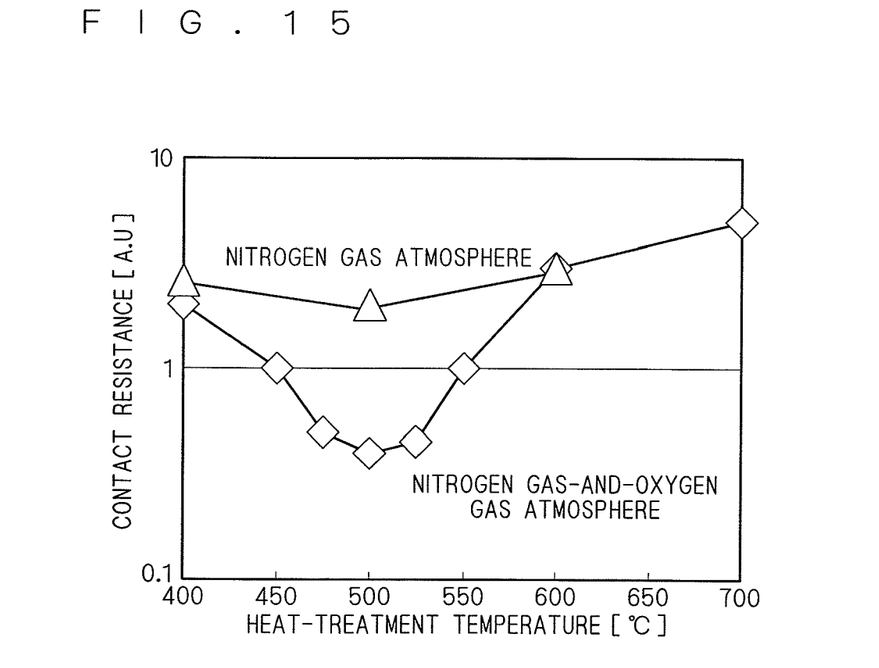
FIG. 15 is a graph showing the relationship between the heat-treatment temperature and the contact resistance between the p-type contact layer 11 and the p electrode 12.

FIG. 14 is a graph showing the relationship between oxygen concentration in the atmosphere during heat treatment and contact resistance between the p-type contact layer 11 and the p electrode 12. FIG. 15 is a graph showing the relationship between heat-treatment temperature and contact resistance between the p-type contact layer 11 and the p electrode 12. In FIG. 14, the horizontal axis represents oxygen concentration (%) in the atmosphere during heat treatment, and the vertical axis represents contact resistance (relative value; A.U). In FIG. 15, the horizontal axis represents heat-treatment temperature (° C.), and the vertical axis represents contact resistance (relative value; A.U). Referring to FIG. 15, a triangle symbol (Δ) represents a case where the p electrode 12 is heat-treated in a nitrogen gas atmosphere; and a diamond-shaped symbol (◇) represents a case where the p electrode 12 is heat-treated in a nitrogen gas and oxygen gas atmosphere.

The graph in FIG. 15 shows that, when the p electrode 12 is heat-treated in an atmosphere including oxygen gas, unlike when in a nitrogen gas atmosphere, an oxygen gas is included in the atmosphere so that the contact resistance between the p-type contact layer 11 and the p electrode 12 is reduced. However, the graph in FIG. 14 shows that excessively high oxygen concentration in the atmosphere will increase the contact resistance. When comparison is made at the same heat-treatment temperature, low oxygen concentration has a better effect of inhibiting oxidation of the Ta film 14 which forms part of the p electrode 12. From this, it is preferable that the oxygen concentration in the atmosphere during heat treatment be between 10 and 50%.

As described above, in the nitride semiconductor device 10 according to the present preferred embodiment, the p electrode 12 is formed of the first Pd film 13, the Ta film 14, and the second Pd film 15, which is an antioxidant film that prevents oxidization of the Ta film 14, and is formed on the p-type contact layer 11 of a nitride semiconductor. On the p electrode 12, the pad electrode 16 is formed. The second Pd film 15 has a thickness of 50 to 150 nm and is formed on the entire upper surface of the Ta film 14 as an antioxidant film that prevents oxidation of the Ta film 14. The presence of this second Pd film 15, which is an antioxidant film, can prevent oxidation of the Ta film 14.

This reduces the resistance that may exist between the p electrode 12 and the pad electrode 16, thereby preventing a failure in contact between the p electrode 12 and the pad electrode 16 and providing the p electrode 12 with low resistance. It is thus possible, as compared with the conventional techniques described above, to reduce the operating voltage of the nitride semiconductor device 10 and to cut heat generation during operation, thereby achieving high-power and stable operation.

Further in the nitride semiconductor device 10 according to the present preferred embodiment, as described above with reference to FIGS. 10 and 11, oxygen atoms are distributed across the p electrode 12 so as to have a peak concentration within the Ta film 14. This reduces the resistance that may exist between the p electrode 12 and the pad electrode 16, thereby preventing a failure in contact between the p electrode 12 and the pad electrode 16 and more reliably ensuring the provision of the p electrode 12 with low resistance.

Also in the nitride semiconductor device 10 according to the present preferred embodiment, the pad electrode 16 includes a Ta film that is formed in contact with the second Pd film 15 which forms part of the p electrode 12. This prevents a failure in contact between the p electrode 12 and the pad electrode 16, thus more reliably ensuring the provision of the p electrode 12 with low resistance.

Still also in the nitride semiconductor device 10 according to the present preferred embodiment, the pad electrode 16 has a Ti—Ta—Ti—Au four layer structure. This prevents a failure in contact between the p electrode 12 and the pad electrode 16 with more reliability, thus more reliably ensuring the provision of the p electrode 12 with low resistance. As an alternative, the pad electrode 16 may have a Ti—Mo—Ti—Au four layer structure. Such a four layer structure can also achieve a similar effect to the Ti—Ta—Ti—Au four layer structure.

In the method of manufacturing the nitride semiconductor device 10 according to the present preferred embodiment, in the p-electrode forming step, the first Pd film 13 and the Ta film 14 are formed in order of mention on the p-type contact layer 11 of a nitride semiconductor and then the second Pd film 15 as an antioxidant film that prevents oxidation of the Ta film 14 is formed to a thickness of 50 to 150 nm on the entire upper surface of the Ta film 14, to thereby form the p electrode 12 of the first Pd film 13, the Ta film 14, and the second Pd film 15. This p electrode 12 is heat-treated in the heat-treatment step.

Since the p electrode 12 has the second Pd film 15 formed as an antioxidant film to a thickness of 50 to 150 nm on the entire upper surface of the Ta film 14, it is possible to prevent the Ta film 14 from being oxidized during the heat treatment of the p electrode 12 in the heat-treatment step. This reduces the resistance that may exist between the p electrode 12 and the pad electrode 16, thereby preventing a failure in contact between the p electrode 12 and the pad electrode 16 and stabilizing the provision of the p electrode 12 with low resistance. It is thus possible, as compared with the conventional techniques described above, to reduce the operating voltage of the nitride semiconductor device 10 and to cut heat generation during operation, thereby producing the nitride semiconductor device 10 that achieves high-power and stable operation.

In the method of manufacturing the nitride semiconductor device 10 according to the present preferred embodiment, in the heat-treatment step, the p electrode 12 should preferably be heat-treated at heat-treatment temperatures in the range of 400 to 500° C., more preferably between 425 and 475° C. This, as described above with reference to FIGS. 12 and 13, reduces the resistance that may exist between the p electrode 12 and the pad electrode 16, thereby preventing a failure in contact between the p electrode 12 and the pad electrode 16 and more reliably ensuring the provision of the p electrode 12 with low resistance.

Also in the method of manufacturing the nitride semiconductor device 10 according to the present preferred embodiment, the p electrode 12 is heat-treated in an atmosphere with an oxygen concentration of 10 to 50%. This, as described above with reference to FIGS. 14 and 15, reduces the resistance that may exist between the p electrode 12 and the pad electrode 16, thereby preventing a failure in contact between the p electrode 12 and the pad electrode 16 and more reliably ensuring the provision of the p electrode 12 with low resistance.

The heat-treatment step may be performed either after the formation of the second Pd film 15 as an antioxidant film on the Ta film 14 as in the present preferred embodiment, or after the pad-electrode forming step in which the pad electrode 16 is formed on the second Pd film 15. Heat-treating the p electrode 12 in the heat-treatment step after the formation of the second Pd film 15 can reduce contact resistance while inhibiting oxidation of the Ta film 14 which forms part of the p electrode 12. Also, heat-treating the p electrode 12 in the heat-treatment step after the pad-electrode forming step can improve adhesion of the p electrode 12 to the pad electrode 16 while inhibiting oxidation of the Ta film 14 which forms part of the p electrode 12.

In the method of manufacturing the nitride semiconductor device 10 according to the present preferred embodiment, in the p-electrode forming step, at least any one of the first Pd film 13, the Ta film 14, and the second Pd film 15 is formed with a controlled oxygen concentration in the atmosphere. This allows control of the concentration profile of oxygen atoms within the p electrode 12, thereby ensuring the provision of the p electrode 12 with low resistance.

Also in the method of manufacturing the nitride semiconductor device 10 according to the present preferred embodiment, the removal step is performed after the heat-treatment step so as to remove the surface of the second Pd film 15 which forms part of the p electrode 12. This, in forming the pad electrode 16 on the second Pd film 15, prevents a failure in contact between the second Pd film 15 and the pad electrode 16, thereby more reliably preventing a failure in contact between the p electrode 12. Thus, the p electrode with low resistance can be provided with more reliability.

Still also in the method of manufacturing the nitride semiconductor device 10 according to the present preferred embodiment, the pad-electrode forming step is performed after the removal step so as to form the pad electrode 16 on the second Pd film 15 which forms part of the p electrode 12. Since the surface of the second Pd film 15 is removed in the removal step after the heat treatment step, the pad electrode 16 is formed on a newly exposed surface of the second Pd film 15 in the pad-electrode forming step. This prevents a failure in contact between the second Pd film 15 and the pad electrode 16, thereby preventing a failure in contact between the p electrode 12 and the pad electrode 16. Thus, the p electrode 12 with low resistance can be provided with more reliability.

Still also in the method of manufacturing the nitride semiconductor device 10 according to the present preferred embodiment, in the removal step, the surface of the second Pd film 15 is removed by etching. This facilitates the removal of the surface of the second Pd film 15.

Figure 16:
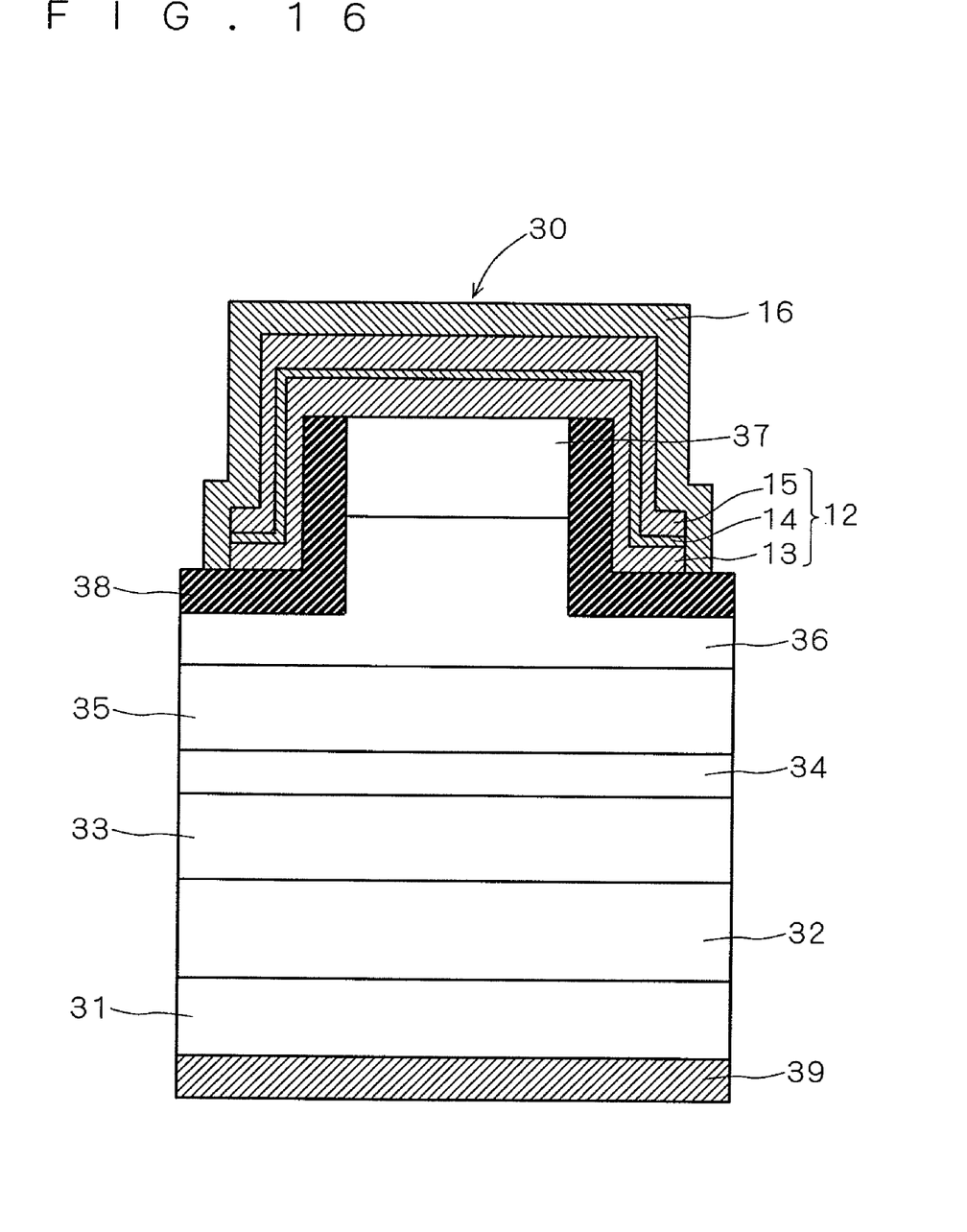
FIG. 16 is a cross-sectional view illustrating the structure of a light-emitting nitride semiconductor device 30.

Next described is a light-emitting nitride semiconductor device 30 that applies the nitride semiconductor device 10 according to the present preferred embodiment. FIG. 16 is a cross-sectional view illustrating the structure of the light-emitting nitride semiconductor device 30. The light-emitting nitride semiconductor device 30 is formed using an n-type gallium nitride (GaN) substrate 31 which is a nitride semiconductor substrate.

A layered structure of a nitride semiconductor is formed on the n-type GaN substrate 31. More specifically, an n-type AlGaN cladding layer 32, an n-type GaN guide layer 33, an active layer 34, a p-type GaN guide layer 35, a p-type AlGaN cladding layer 36, and a p-type GaN contact layer 37 are formed in order of mention on the n-type GaN substrate 31.

The n-type GaN substrate 31 and the above-described layered structure form a laser diode element (nitride semiconductor element). The p electrode 12 is formed on the p-type GaN contact layer 37 which is equivalent to the p-type contact layer 11 of the nitride semiconductor device 10, and the pad electrode 16 is formed on this p electrode 12. The p-type AlGaN cladding layer 36 and the p-type GaN contact layer 37 are patterned into a given shape by etching. The p electrode 12 is formed of the first Pd film 13, the Ta film 14, and the second Pd film 15. The first Pd film 13, the Ta film 14, and the second Pd film 15 are formed in order of mention on the p-type GaN contact layer 37. The second Pd film 15 is an antioxidant film and is formed on the entire upper surface of the Ta film 14 to prevent oxidation of the Ta film 14. As a protective film, an $SiO_2$ film 38 is formed on part of the surface of the p-type AlGaN cladding layer 36. Furthermore, an n electrode 39 is provided as a metal electrode on the underside of the n-type GaN substrate 31.

In the light-emitting nitride semiconductor device 30, the second Pd film 15 which is an antioxidant film that prevents oxidation of the Ta film 14 is formed to cover the entire upper surface of the Ta film 14 which forms part of the p electrode 12. This reduces the resistance that may exist between the p electrode 12 and the pad electrode 16, thus preventing a failure in contact between the p electrode 12 and the pad electrode 16 and providing the p electrode 12 with low resistance. It is thus possible, as compared with the conventional techniques described above, to reduce the operating voltage of the light-emitting nitride semiconductor device 30 and to cut heat generation during operation, thereby achieving high-power and stable operation.

While the invention has been shown and described in detail, the foregoing description is in all aspects illustrative and not restrictive. It is therefore understood that numerous modifications and variations can be devised without departing from the scope of the invention.

What is claimed is:

1. A nitride semiconductor device comprising:
   a p-type contact layer formed of a nitride semiconductor;
   a p electrode formed of a first palladium (Pd) film and a tantalum (Ta) formed in order of mention on said p-type contact layer, and of a second Pd film formed on an entire upper surface of said Ta film; and
   a pad electrode formed on said p electrode,
   said second Pd film, which forms part of said p electrode, having a thickness of 50 to 150 nm.

2. The nitride semiconductor device according to claim 1, wherein
   said p electrode contains an oxygen atom,
   a concentration profile of said oxygen atom has a peak concentration within said Ta film which forms part of said p electrode.

3. The nitride semiconductor device according to claim 1, wherein
   said pad electrode includes a titanium (Ti) film,
   said Ti film being formed in contact with said second Pd film which forms part of said p electrode.

4. The nitride semiconductor device according to claim 3, wherein
   said pad electrode has either a Ti—Ta—Ti—Au four-layer structure in which said Ti film, a tantalum (Ta) film, another Ti film, and a gold (Au) film are formed in order of mention on said p electrode, or a Ti—Mo—Ti—Au four-layer structure in which said Ti film, a molybdenum (Mo) film, another Ti film, and a gold (Au) film are formed in order of mention on said p electrode.

5. A method of manufacturing a nitride semiconductor device comprising:
   a p-electrode forming step of forming a first palladium (Pd) film and a tantalum (Ta) film in order of mention on a p-type contact layer of a nitride semiconductor and then forming a second Pd film as an antioxidant film that prevents oxidation of said Ta film, on an entire upper surface of said Ta film, to thereby form a p electrode of said first Pd film, said Ta film, and said second Pd film; and a heat-treatment step of heat-treating said p electrode formed, wherein, in said p-electrode forming step, said second Pd film is formed to a thickness of 50 to 150 nm.

6. The method of manufacturing a nitride semiconductor device according to claim 5, wherein in said heat-treatment step, said p electrode is heat-treated at a heat-treatment temperature in the range of 400 to 500° C.

7. The method of manufacturing a nitride semiconductor device according to claim 5, wherein in said heat-treatment step, said p electrode is heat-treated in an atmosphere with an oxygen concentration of 10 to 50%.

8. The method of manufacturing a nitride semiconductor device according to claim 5, wherein in said p-electrode forming step, at least one of said first Pd film, said Ta film, and said second Pd film is formed with a controlled oxygen concentration in the atmosphere.

9. The method of manufacturing a nitride semiconductor device according to claim 5, further comprising:

after said heat-treatment step, a removal step of removing a surface of said second Pd film.

10. The method of manufacturing a nitride semiconductor device according to claim 9, further comprising:

after said removal step, a pad-electrode forming step of forming a pad electrode on said second Pd film.

11. The method of manufacturing a nitride semiconductor device according to claim 9, wherein in said removal step, a surface of said second Pd film is removed by etching.

12. A nitride semiconductor device comprising:

a p-type nitride semiconductor contact layer;

an electrode including a first palladium film and a tantalum film sequentially disposed on said p-type nitride semiconductor contact layer so that said first palladium film contacts said p-type nitride semiconductor contact layer, and a second palladium film covering said tantalum film and having a thickness in a range from 50 to 150 nm; and a pad electrode disposed on said electrode.

13. The nitride semiconductor device according to claim 12, wherein said electrode contains oxygen having a concentration profile including a peak concentration within said tantalum film.

14. The nitride semiconductor device according to claim 12, wherein said pad electrode includes a titanium film in contact with said second palladium film.

15. The nitride semiconductor device according to claim 12, wherein said pad electrode has a four-layer structure including a first titanium film, a tantalum film, a second titanium film, and a gold film sequentially disposed on said electrode.

16. The nitride semiconductor device according to claim 12, wherein said pad electrode has a four-layer structure including a first titanium film, a molybdenum film, a second titanium film, and a gold film sequentially disposed on said electrode.

* * * * *